(12) United States Patent
Kushihara

(10) Patent No.: US 6,608,573 B2
(45) Date of Patent: Aug. 19, 2003

(54) AUTOMATIC RESOLUTION CHANGING METHOD AND CIRCUIT FOR USE IN DIGITAL CONVERSION OF TWO-PHASE SINUSOIDAL WAVE SIGNALS

(75) Inventor: Hiroshi Kushihara, Nagano-ken (JP)

(73) Assignee: Tamagawa Seiki Kabushiki Kaisha, Nagano-Ken (JP)

( * ) Notice: Subject to any disclaimer, the term of this patent is extended or adjusted under 35 U.S.C. 154(b) by 0 days.

(21) Appl. No.: 09/961,272

(22) Filed: Sep. 25, 2001

(65) Prior Publication Data

US 2002/0070885 A1 Jun. 13, 2002

(30) Foreign Application Priority Data

Oct. 20, 2000 (JP) ........................................ 2000-320751

(51) Int. Cl.$^7$ ............................................... H03M 1/22
(52) U.S. Cl. ........................................ 341/116; 341/111
(58) Field of Search .......................................... 341/116

(56) References Cited

U.S. PATENT DOCUMENTS

| | | | |
|---|---|---|---|
| 4,630,928 A | * 12/1986 | Klingler et al. | 341/116 |
| 4,847,879 A | * 7/1989 | Iijima et al. | 377/43 |
| 5,079,549 A | * 1/1992 | Liessner | 341/116 |
| 5,796,357 A | * 8/1998 | Kushihara | 341/116 |
| 5,814,524 A | 9/1998 | Walt et al. | |

FOREIGN PATENT DOCUMENTS

JP    11-084320    6/2000

OTHER PUBLICATIONS

"Conversion angulaire: le cap monolithique est franchi" Mesures Regulation Automatisme, 9, Nov. 9, 1987, pp. 22–24, XP–002234970, Paris, France.

* cited by examiner

Primary Examiner—Howard L. Williams
(74) Attorney, Agent, or Firm—Sughrue Mion, PLLC

(57) ABSTRACT

The present invention provides an automatic resolution changing method and circuit for use in a high-precision digital conversion of two-phase sinusoidal wave signals. The angular velocity (dφ/dt) of the rotor obtained from the difference between these two-phase sinusoidal wave signals is integrated by a counter. Subsequently, digital conversion of the rotation angle (θ) of the rotor with respect to the stator is performed, and a result of the digital conversion is outputted. At this time, in the case where the angular velocity (dφ/dt) is equal to or higher than a first percentage of the follow-up speed at the current resolution of the counter, the resolution of the counter is reduced. Further, in the case where the angular velocity (dφ/dt) is equal to or lower than a second percentage of the follow-up speed at the current resolution of the counter, the resolution of the counter is increased.

4 Claims, 3 Drawing Sheets

AUTOMATIC RESOLUTION CHANGING METHOD AND CIRCUIT FOR USE IN DIGITAL CONVERSION OF TWO-PHASE SINUSOIDAL WAVE SIGNALS

BACKGROUND OF THE INVENTION

1. Field of the Invention

The present invention generally relates to an automatic resolution changing method and circuit for use in digital conversion of two-phase sinusoidal wave signals and, more particularly, to an automatic resolution changing method and circuit for use in digital conversion of two-phase sinusoidal wave signals, which provides high resolution during the low speed rotation of, for example, a resolver rotor or an encoder shaft, and which provides high followability during the high speed rotation thereof.

2. Description of the Related Art

Hitherto, conventional methods have been performed in conventional digital conversion circuits, as illustrated in FIG. 3, for digital conversion of, for instance, two-phase sinusoidal wave signals. That is, in FIG. 3, reference numeral 1 designates a first multiplying D/A converter for multiplying an output of a COS ROM 2, to which an angular output ($\phi$) of a known resolver (not shown) is fed back and inputted, by a sinusoidal component $\sin\theta \cdot \sin\omega t$ of a resolver signal and for outputting a result of the multiplication, that is, $\sin\theta \cdot \cos\phi \cdot \sin\omega t$ as a first converter output. Incidentally, "$\sin\omega t$" denotes an excitation signal for the resolver.

Similarly, a second multiplying D/A converter 3 is operative to multiply an output of a SIN ROM 4, to which an angular output ($\phi$) of the resolver is fed back and inputted, by a cosinusoidal component $\cos\theta \cdot \sin\omega t$ of a resolver signal and for outputting a result of the multiplication, that is, $\cos\theta \cdot \sin\phi \cdot \sin\omega t$ as a second converter output.

A phase sensitive detection circuit 5 is connected to an output terminal of both the first multiplying D/A converter 1 and the second multiplying D/A converter 3. A signal representing a value obtained by subtracting the second converter output $\cos\theta \cdot \sin\phi \cdot \sin\omega t$ of the second multiplying D/A converter 3 from the first converter output $\sin\theta \cdot \cos\phi \cdot \sin\omega t$ of the first multiplying D/A converter 1 is inputted to the phase sensitive detection circuit 5, which then outputs a control residual $\epsilon$. Incidentally, $\epsilon = \sin\theta \cdot \cos\phi - \cos\theta \cdot \sin\phi = \sin(\theta - \phi)$.

The control residual $\epsilon$ is inputted to a compensator 6, from which an angular velocity $d\phi/dt$ (=$\phi$dot) is then outputted. This compensator 6 is designed according to the characteristics of a counter 7 in the subsequent stage. For example, when the counter 7 has a first-order integral element, it is sufficient that a feedback control system is constituted in such a way as to have PI (Proportional+Integral) control elements, which include a first order lag filter, to thereby control the counter 7 stably with high accuracy at high speeds.

The angular velocity $d\phi/dt$ (=$\phi$dot) is inputted to the counter 7, which is a plant, and then integrated therein and subsequently, outputted as a digital angular output $\phi$ (that is, an output counter value).

Incidentally, in the present specification, the angular velocity $d\phi/dt$ and rotation angle are assumed to be expressed in electrical angles.

The conventional conversion circuit is configured as described above, and thus has the following drawbacks. That is, although the enhancement of resolution during the low speed rotation of, for example, a resolver rotor or of an encoder shaft, and the improvement of followability during the high speed rotation thereof are required of the aforementioned tracking system, which is a closed loop negative feedback circuit, for digital conversion of a resolver signal, the resolution with respect to the rotation angle is inversely proportional to the follow-up speed. Moreover, the range of the follow-up speed is uniquely determined according to the conversion performance of the circuit, so that the circuit is forced to be used within an allowable range of the follow-up speed. Thus, it is difficult to manage both the high resolution during the low speed rotation of, for example, a resolver rotor and the high followability during the high speed rotation thereof.

Further, the conventional conversion circuit has such a drawback not only in the case of applying this conventional conversion circuit to a resolver but the case of applying this conventional conversion circuit to an angular signal outputted by an encoder. That is, such a signal outputted from the encoder has no excitation component. The block configuration of the digital conversion circuit for digital conversion of an angular signal outputted from an encoder is obtained by removing the $\sin\omega t$ component of each of the signals and by omitting the phase sensitive detection circuit 5 therein. However, in such digital conversion circuit for digital conversion of angular signals outputted from an encoder, an angular velocity $d\phi/dt$ (=$\phi$dot) outputted from the compensator 6 is integrated in the counter 7, and subsequently, the result of the integration is outputted as a digital angular output $\phi$. Therefore, the conversion circuit has a drawback similar to the aforementioned in the case of the circuit for digital conversion of a resolver signal.

The present invention was developed to eliminate the aforementioned drawbacks. Accordingly, an object of the present invention is to provide an automatic resolution changing method for use in digital conversion of two-phase sinusoidal wave signals, which provides high resolution during the low speed rotation of a resolver rotor or of an encoder shaft, and which provides high followability during the high speed rotation thereof.

SUMMARY OF THE INVENTION

To achieve the foregoing object, according to an aspect of the present invention, there is provided an automatic resolution changing method for use in a high-precision digital conversion of two-phase sinusoidal wave signals. This automatic resolution changing method comprises the steps of detecting a two-phase-sinusoidal-wave-like A-phase output and a two-phase-sinusoidal-wave-like B-phase output, which are outputted based on the rotation of a rotor with respect to a stator, integrating an angular velocity of the rotor on the basis of the control residual obtained from the two-phase sinusoidal wave signals in a counter, performing digital conversion of the rotation angle ($\theta$) of the rotor with respect to the stator, and outputting a result of the digital conversion. Further, when the result of the digital conversion is outputted, in the case where the angular velocity is equal to or higher than a first percentage of a follow-up speed at a current resolution of the counter, the resolution of the counter is reduced, while in the case where the angular velocity is equal to or lower than a second percentage of the follow-up speed at the current resolution of the counter, the resolution of the counter is increased. Thus, the present invention can provide a method of performing digital conversion of two-phase sinusoidal wave signals.

Further, in the case of an embodiment of this automatic resolution changing method for use in a high-precision digital conversion of two-phase sinusoidal wave signals, when the resolution of the counter is reduced, the resolution thereof is reduced by 1 bit. Moreover, when the resolution of the counter is increased, the resolution thereof is increased by 1 bit. Thus, the present invention can provide a method of performing digital conversion of two-phase sinusoidal wave signals, which provides good followability.

Moreover, in the case of an embodiment of this automatic resolution changing method for use in a high-precision digital conversion of two-phase sinusoidal wave signals, the above first percentage is 87.5%, and the second percentage is 37.5%. Thus, the present invention can provide a method of performing digital conversion of two-phase sinusoidal wave signals, which provides high followability.

Furthermore, according to another aspect of the present invention, there is provided an automatic resolution changing circuit for use in digital conversion of two-phase sinusoidal wave signals. This automatic resolution changing circuit has a first converter for receiving a two-phase-sinusoidal-wave-like A-phase output, which is outputted based on the rotation of a rotor with respect to a stator, and for outputting a first converter output, a second converter for receiving a two-phase-sinusoidal-wave-like B-phase output, which is outputted based on the rotation of the rotor with respect to the stator, and for outputting a second converter output, a compensator for outputting an angular velocity of the rotor from the difference between the first converter output and the second converter output through a phase sensitive detection circuit, and a counter for integrating the angular velocity of the rotor, which is outputted from the compensator. This digital conversion circuit is adapted to perform digital conversion of a rotation angle of the rotor with respect to the stator and to output a result of the digital conversion. Further, this automatic resolution changing circuit for use in a high-precision digital conversion of two-phase sinusoidal wave signals, further comprises a changing circuit for reducing the resolution of the counter in a case where the angular velocity is equal to or higher than a first percentage of a follow-up speed at a current resolution of said counter for outputting the result of the digital conversion, and for increasing the resolution of the counter in the case where the angular velocity is equal to or lower than a second percentage of the follow-up speed at the current resolution of the counter for outputting the result of the digital conversion. Thus, the present invention can provide a circuit for performing high-precision digital conversion of two-phase sinusoidal wave signals, which provides high followability.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DETAILED DESCRIPTION OF THE PREFERRED EMBODIMENTS

Figure 1:
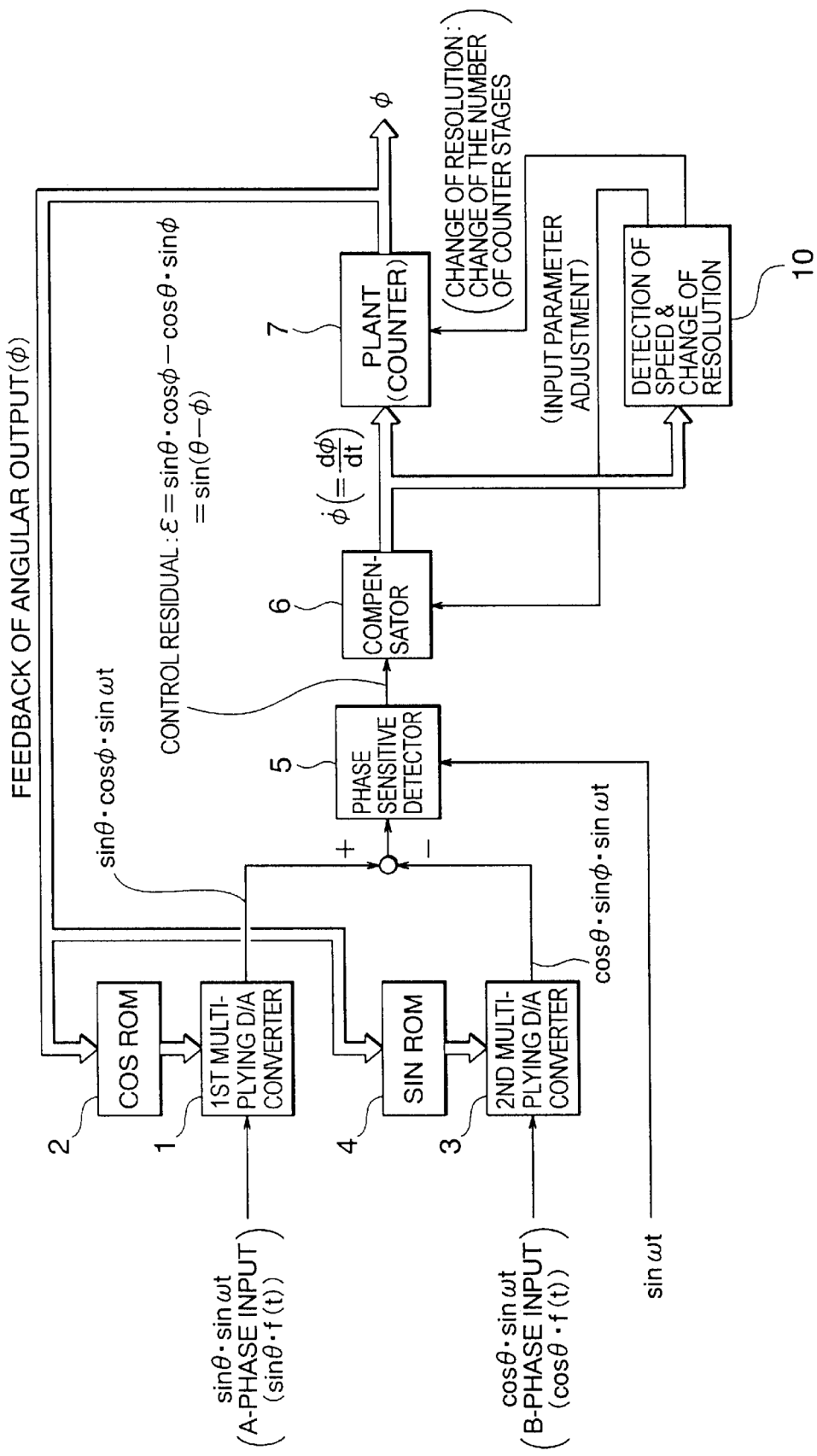
FIG. 1 is a schematic diagram illustrating an automatic resolution changing circuit of the present invention for use in digital conversion of two-phase sinusoidal wave signals.

Hereinafter, the preferred embodiments of the present invention, that is, an automatic resolution changing method and circuit, which embody the present invention, for use in digital conversion of two-phase sinusoidal wave signals will be described in detail by referring to the accompanying drawings.

Incidentally, in the drawings, like reference characters designate like or equivalent portions of the conventional conversion circuit. Thus, the description of such portions is omitted herein.

Additionally, in the present specification, the angular velocity $d\phi/dt$ and rotation angle are assumed to be expressed in electrical angles.

As illustrated in FIG. 1, the automatic resolution changing circuit for use in digital conversion of two-phase sinusoidal wave signals has a changing circuit 10, provided at the output side of the compensator 6, for changing the resolution of digital conversion according to the angular velocity $d\phi/dt$ (=$\phi$dot) outputted from the compensator 6. The automatic resolution changing circuit, which embodies the present invention, for use in digital conversion of two-phase sinusoidal wave signals is performed by this conversion circuit.

This changing circuit 10 is used for adjusting input parameters to be inputted to the compensator 6 and changing the resolution of the counter 7 according to the angular velocity $d\phi/dt$ (=$\phi$dot) outputted from the compensator 6.

Figure 2:
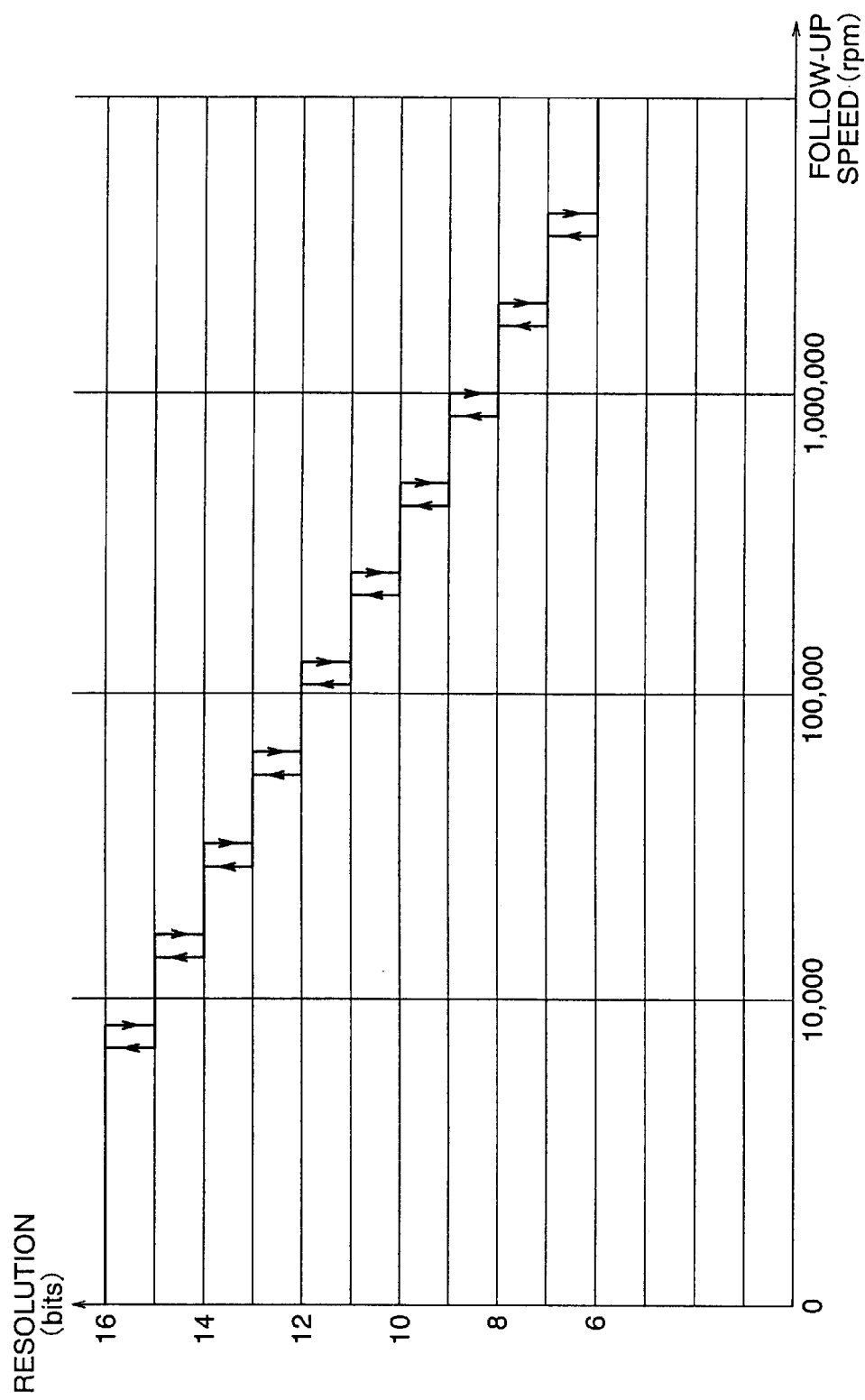
FIG. 2 is a characteristic diagram illustrating the resolution changing characteristic of the automatic resolution changing circuit of the present invention for use in digital conversion of two-phase sinusoidal wave signals.
Figure 3:
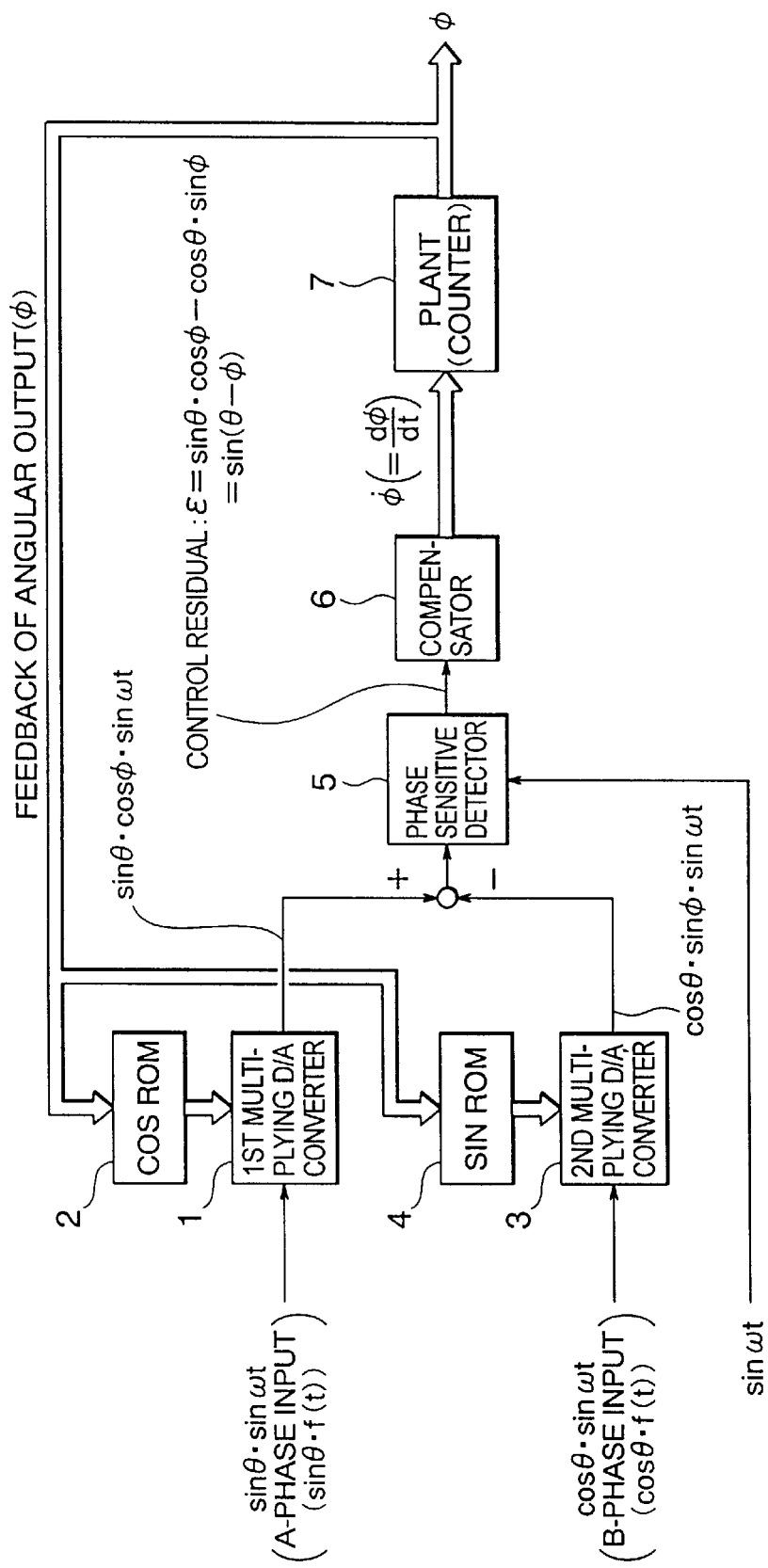
FIG. 3 is a schematic diagram illustrating a conventional digital conversion circuit for performing digital conversion of two-phase sinusoidal wave signals.

The following TABLE 1 describes the relation among the resolution (bits) of the counter, (the theoretical values of) the follow-up speed (rpm), threshold values (rpm) for changing the resolution, and the frequency (kHz) of a resolver signal. FIG. 2 is a characteristic graph illustrating the relation between the follow-up speed and the resolution in the form of a semi-logarithmic scale.

TABLE 1

| set level | set resolution (bits) total | set resolution (bits) fine side | follow-up speed (rpm) (theoretical value) | resolution changing threshold value (rpm) coarse side (1X) | resolution changing threshold value (rpm) fine side (512X) | frequency of resolver signal (KHz) |
|---|---|---|---|---|---|---|
| 0 | 25 | 16 | 9,155 | — | — | 0.15 |
|   |   |   |   | 15.64 | 8,010 |   |
| 1 | 24 | 15 | 18,310 | 13.45 | 6,867 | 0.31 |
|   |   |   |   | 31.29 | 16,021 |   |
| 2 | 23 | 14 | 36,621 | 26.83 | 13,733 | 0.61 |
|   |   |   |   | 62.58 | 32,043 |   |
| 3 | 22 | 13 | 73,242 | 53.65 | 27,466 | 1.22 |
|   |   |   |   | 125.16 | 64,086 |   |

TABLE 1-continued

| | set resolution (bits) | | follow-up speed (rpm) (theoretical value) | resolution changing threshold value (rpm) | | frequency of resolver signal (KHz) |
|---|---|---|---|---|---|---|
| set level | total | fine side | | coarse side (1X) | fine side (512X) | |
| 4 | 21 | 12 | 146,484 | 107.29 | 54,932 | 2.44 |
| | | | | 250.33 | 128,173 | |
| 5 | 20 | 11 | 292,968 | 214.58 | 109,864 | 4.88 |
| | | | | 500.67 | 256,347 | |
| 6 | 19 | 10 | 585,937 | 429.16 | 219,727 | 9.77 |
| | | | | 1001.35 | 512,695 | |
| 7 | 18 | 9 | 1,171,875 | 858.31 | 439,454 | 19.53 |
| | | | | 2002.71 | 1,025,390 | |
| 8 | 17 | 8 | 2,343,750 | 1716.62 | 878,907 | 39.06 |
| | | | | 4005.43 | 2,050,781 | |
| 9 | 16 | 7 | 4,687,500 | 3433.23 | 1,757,813 | 78.13 |
| | | | | 8010.86 | 4,101,562 | |
| 10 | 15 | 6 | 9,375,000 | 6866.46 | 3,515,625 | 156.25 |
| | | | | (18310.54) | (9,375,000) | | wherein upper values of resolution changing threshold values of each set level are the resolution changing threshold values for increasing the resolution of the counter, and lower values of resolution changing threshold values of each set level are the resolution changing threshold values for reducing the resolution of the counter.

As described in TABLE 1, in the case of reducing the resolution, a resolution changing threshold value for changing the resolution is set at a value that is 87.5% of (the theoretical value of) the follow-up speed corresponding to the current resolution. Further, in the case of increasing the resolution, a resolution changing threshold value for changing the resolution is set at a value that is 37.5% of (the theoretical value of) the follow-up speed corresponding to the current resolution.

That is, as illustrated in FIG. 2, when the angular velocity $d\phi/dt$ ($=\phi dot$) is equal to or higher than the resolution changing threshold value for reducing the resolution described in TABLE 1, the resolution is reduced by 1 bit. When the angular velocity $d\phi/dt$ ($=\phi dot$) is equal to or higher than the resolution changing threshold value for increasing the resolution described in TABLE 1, the resolution is increased by 1 bit.

Incidentally, the values listed in TABLE 1 are stored and held in a ROM of the changing circuit 10. This conversion circuit is adapted so that a logical circuit provided in the changing circuit 10 automatically changes the resolution.

Hereinafter, the automatic resolution changing method and circuit, which uses the changing circuit 10 having such resolution changing characteristics, for digital conversion of two-phase sinusoidal wave signals will be concretely described for a case where the maximum resolution of the counter 7 during the halt of or low speed rotation of a resolver rotor is 16 (bit per revolution), and that the highest frequency of an input signal to the counter 7 during the high speed rotation of the resolver rotor is 10 (MHz).

First, the highest follow-up speed $d\phi/dt_{16}$ is determined in such a manner as to meet the following condition.

$$d\phi/dt_{16} < 9155(\text{rpm}) \approx 10(\text{MHz})/2^{16} \times 60$$

On the other hand, in practical applications thereof, high-precision and high-resolution angle detection is performed by concurrently using multipolarized sensors. That is, substantially high precision and resolution are obtained by synthesizing a total detection signal from detection signals outputted from these sensors.

For example, a total resolution of 25 bits (=16+9 (note that $512=2^9$)) can be obtained by assuming a coarse and fine side to be 1× and 512×, respectively, and setting the resolution of the fine side at 16 bits.

Further, when this electrical angle maximum follow-up speed $d\phi/dt_{16}$ is employed, at the coarse resolution, the follow-up speed obtained by what is called an input mechanical axis conversion is $55/512 \approx 17.9$ (rpm). This value is far less than 6000 (rpm) considered as a value of the speed at which an ordinary servo system operates without a hitch.

However, in this case, according to the automatic resolution changing method of the present invention for use in digital conversion of two-phase sinusoidal wave signals, the changing circuit 10 detects that the angular velocity is equal to or higher than the resolution changing threshold value (15.63 (rpm) in this embodiment) for the case of reducing the resolution. Thus, the resolution is set at a value that is less than the current value by 1 bit. Consequently, the set resolution is 15 bits. However, even in this case, the follow-up speed of 6000 (rpm) cannot be realized.

Further, in the case where the set resolution is 15 bits, the electrical angle follow-up speed $d\phi/dt_{16}$ meets the following condition:

$$d\phi/dt_{16} < 18310(\text{rpm}) (\approx 10(\text{MHz})/2^{15} \times 60).$$

Thus, the follow-up speed becomes twice the value thereof in the case where the resolution is 16 bits.

In this case, the follow-up speed obtained by the input mechanical axis conversion at the coarse side is $18310/512 \approx 35.8$ (rpm). Thus, the follow-up speed of 6000 (rpm) cannot be realized yet.

Thus, when the resolution of the digital conversion is reduced to 7 bits by decreasing the resolution of the counter 7 still more, the followable rotational speed comes to range from 3433.23 (rpm) to 8010.86 (rpm) (see TABLE 1). Thus, 6000 (rpm) considered as a value of the speed at which an ordinary servo system operates without a hitch, is included in this range. Consequently, the speed of 6000 (rpm) obtained by the input mechanical axis conversion at the coarse side is the followable speed of this embodiment.

Incidentally, as is understood from TABLE 1, when the resolution at a fine resolution digital conversion is 7 bits, the resolution of 16 bits can be obtained at the side resolution conversion.

As described above, the change of the resolution according to the angular velocity by the automatic resolution changing method and circuit of the present invention for use in digital conversion of two-phase sinusoidal wave signals is effective in maintaining the tracking performance, which corresponds to the frequency of a count input signal of a counter and considered as a product of the resolution and the follow-up speed, at a high level, from the viewpoint of the digital conversion itself. Consequently, the present invention provides a method for use in high-precision digital conversion of two-phase sinusoidal wave signals.

Incidentally, because the follow-up speed is increased, reductions in the set resolution of the counter 7 do not seriously affect the speed control performance of the system.

Additionally, in the foregoing description, the case of applying the automatic resolution changing method and circuit of the present invention, which is used for digital conversion of two-phase sinusoidal wave signals, to a resolver has been described. However, the automatic resolution changing method and circuit of the present invention can be applied to an encoder for the following reasons. That is, differently from the case of a resolver, an encoder does not output the excitation component $f(t)=\sin \omega t$. However, an encoder is similar to a resolver in that the angular velocity $d\phi/dt$ (=$\phi$dot) outputted from the compensator is integrated by the counter and that the result of the integration is outputted as a digital angular output (or electrical angle output) $\phi$. Thus, the present invention can be applied to encoder by detecting this angular velocity $d\phi/dt$ and then changing the resolution of the counter.

With the construction described above, a automatic resolution changing method and circuit according to the present invention can provide advantages below.

Since a automatic resolution changing method for use in a high-precision digital conversion of two-phase sinusoidal wave signals comprising the steps of: detecting a two-phase-sinusoidal-wave-like A-phase output (sin $\theta$·f(t)) and a two-phase-sinusoidal-wave-like B-phase output (cos $\theta$·f(t)), which are outputted based on rotation of a rotor with respect to a stator; integrating an angular velocity ($d\phi/dt$) of said rotor obtained from the control residual between the two-phase sinusoidal wave signals in a counter; performing digital conversion of a rotation angle ($\theta$) of said rotor with respect to said stator; and outputting a result of the digital conversion, wherein for outputting the result of the digital conversion, in a case where the angular velocity ($d\phi/dt$) is equal to or higher than a first percentage of a follow-up speed at a current resolution of said counter, the resolution of said counter is reduced, while in a case where the angular velocity ($d\phi/dt$) is equal to or lower than a second percentage of the follow-up speed at the current resolution of said counter, the resolution of said counter is increased. Thus, the present invention can provide a method for use in high-precision digital conversion of two-phase sinusoidal wave signals.

Moreover, the automatic resolution changing method for use in a high-precision digital conversion of two-phase sinusoidal wave signals according to claim 1, wherein when the resolution of said counter is reduced, the resolution thereof is reduced by 1 bit, and wherein when the resolution of said counter is increased, the resolution thereof is increased by 1 bit. Thus, the present invention can provide a method for use in high-precision digital conversion of two-phase sinusoidal wave signals, which provides high followability during the rotation thereof.

Further, the automatic resolution changing method for use in a high-precision digital conversion of two-phase sinusoidal wave signals according to claim 1 or 2, wherein said first percentage is 87.5%, and said second percentage is 37.5%. Thus, the present invention can provide a method for use in high-precision digital conversion of two-phase sinusoidal wave signals, which provides high followability during the rotation thereof.

Furthermore, the automatic resolution changing circuit for use in a high-precision digital conversion of two-phase sinusoidal wave signals, said automatic resolution changing circuit having: a first converter for receiving a two-phase-sinusoidal-wave-like A-phase output, which is outputted based on rotation of a rotor with respect to a stator, and for outputting a first converter output (sin $\theta$·cos $\phi$·f(t)); a second converter for receiving a two-phase-sinusoidal-wave-like B-phase output, which is outputted based on rotation of said rotor with respect to said stator, and for outputting a second converter output (cos $\theta$·sin $\phi$·f(t)); a compensator for outputting an angular velocity ($d\phi/dt$) of said rotor from the difference (sin($\theta-\phi$)·f(t)) between the first converter output (sin $\theta$·cos $\phi$·f(t)) and the second converter output (cos $\theta$·sin $\phi$·f(t)) through a phase sensitive detection circuit; and a counter for integrating the angular velocity ($d\phi/dt$) of said rotor, which is outputted from said compensator, said digital conversion circuit adapted to perform digital conversion of the rotation angle ($\theta$) of said rotor with respect to said stator and to output a result of the digital conversion, said automatic resolution changing circuit for use in a high-precision digital conversion of two-phase sinusoidal wave signals, further comprising: a changing circuit for reducing the resolution of said counter in a case where the angular velocity ($d\phi/dt$) is equal to or higher than a first percentage of a follow-up speed at a current resolution of said counter for outputting the result of the digital conversion, and for increasing the resolution of said counter in a case where the angular velocity ($d\phi/dt$) is equal to or lower than a second percentage of the follow-up speed at the current resolution of said counter for outputting the result of the digital conversion. Thus, the present invention can provide a circuit for use in high-precision digital conversion of two-phase sinusoidal wave signals.

Although the preferred embodiments of the present invention have been described above, it should be understood that the present invention is not limited thereto and that other modifications will be apparent to those skilled in the art without departing from the spirit of the invention.

The scope of the present invention, therefore, should be determined solely by the appended claims.

What is claimed is:

1. A automatic resolution changing method for use in a high-precision digital conversion of two-phase sinusoidal wave signals, said automatic resolution changing method comprising the steps of:

detecting a two-phase-sinusoidal-wave-like A-phase output (sin $\theta$·f(t)) and a two-phase-sinusoidal-wave-like B-phase output (cos $\theta$·f(t)), which are outputted based on rotation of a rotor with respect to a stator;

integrating an angular velocity ($d\phi/dt$) of said rotor obtained from the control residual (sin($\theta-\phi$)) between the two-phase sinusoidal wave signals in a counter;

performing digital conversion of a rotation angle ($\theta$) of said rotor with respect to said stator; and outputting a result of the digital conversion, wherein for outputting the result of the digital conversion, in a case where the angular velocity ($d\phi/dt$) is equal to or higher than a first percentage of a follow-up speed at a current resolution of said counter, the resolution of said counter is reduced, while in a case where the angular velocity ($d\phi/dt$) is equal to or lower than a second percentage of the follow-up speed at the current resolution of said counter, the resolution of said counter is increased.

2. The automatic resolution changing method for use in a high-precision digital conversion of two-phase sinusoidal wave signals according to claim 1, wherein when the resolution of said counter is reduced, the resolution thereof is reduced by 1 bit, and wherein when the resolution of said counter is increased, the resolution thereof is increased by 1 bit.

3. The automatic resolution changing method for use in a high-precision digital conversion of two-phase sinusoidal wave signals according to claim 1, wherein said first percentage is 87.5%, and said second percentage is 37.5%.

4. A automatic resolution changing circuit for use in a high-precision digital conversion of two-phase sinusoidal wave signals, said automatic resolution changing circuit having:

a first converter for receiving a two-phase-sinusoidal-wave-like A-phase output, which is outputted based on rotation of a rotor with respect to a stator, and for outputting a first converter output ($\sin\theta \cdot \cos\phi \cdot f(t)$);

a second converter for receiving a two-phase-sinusoidal-wave-like B-phase output, which is outputted based on rotation of said rotor with respect to said stator, and for outputting a second converter output ($\cos\theta \cdot \sin\phi \cdot f(t)$);

a compensator for outputting an angular velocity ($d\phi/dt$) of said rotor from the difference ($\sin(\theta-\phi) \cdot f(t)$) between the first converter output ($\sin\theta \cdot \cos\phi \cdot f(t)$) and the second converter output ($\cos\theta \cdot \sin\phi \cdot f(t)$) through a phase sensitive detection circuit; and a counter for integrating the angular velocity ($d\phi/dt$) of said rotor, which is outputted from said compensator, said digital conversion circuit adapted to perform digital conversion of the rotation angle ($\theta$) of said rotor with respect to said stator and to output a result of the digital conversion, said automatic resolution changing circuit for use in a high-precision digital conversion of two-phase sinusoidal wave signals, further comprising:

a changing circuit for reducing the resolution of said counter in a case where the angular velocity ($d\phi/dt$) is equal to or higher than a first percentage of a follow-up speed at a current resolution of said counter when the result of the digital conversion is outputted, and for increasing the resolution of said counter in a case where the angular velocity ($d\phi/dt$) is equal to or lower than a second percentage of the follow-up speed at the current resolution of said counter when the result of the digital conversion is outputted.

* * * * *